United States Patent [19]
Lee

[11] Patent Number: 5,771,199
[45] Date of Patent: Jun. 23, 1998

[54] INTEGRATED CIRCUIT MEMORY DEVICES HAVING IMPROVED DUAL MEMORY BANK CONTROL CAPABILITY AND METHODS OF OPERATING SAME

[75] Inventor: Si-yeol Lee, Kyungki-do, Rep. of Korea

[73] Assignee: Samsung Electronics Co., Ltd., Suwon, Rep. of Korea

[21] Appl. No.: 770,846

[22] Filed: Dec. 20, 1996

[30] Foreign Application Priority Data

Dec. 29, 1995 [KR] Rep. of Korea ................. 1995-66882

[51] Int. Cl.$^6$ ........................................ G11C 8/00
[52] U.S. Cl. ........................... 365/230.03; 365/233
[58] Field of Search ................. 365/230.03, 233

[56]  References Cited

U.S. PATENT DOCUMENTS 5,592,434  1/1997  Iwamoto et al. ................ 365/233
5,619,471  4/1997  Nunziata ....................... 365/230.03

*Primary Examiner*—David C. Nelms
*Assistant Examiner*—Hoai V. Ho
*Attorney, Agent, or Firm*—Myers, Bigel, Sibley & Sajovec

[57]  ABSTRACT

Integrated circuit memory devices having improved dual memory bank control include circuits therein for controlling at least one pair of memory banks (e.g., DRAM memory banks) using a single row address strobe ($\overline{RAS}$) signal. Such memory devices include first and second banks of memory cells and a memory bank control circuit coupled thereto for selectively disposing the first and second banks of memory cells in active modes of operation during respective nonoverlapping time intervals, in response to first and second master clock signals. The first and second master clock signals are generated by a single master clock signal generator comprising a row address strobe buffer and a bank select buffer. The strobe buffer is responsive to a row address strobe signal and the bank select buffer is responsive to outputs from the strobe buffer and a bank select signal. The bank select buffer preferably generates the first and second master clock signals at first logic potentials (e.g., logic 1) during nonoverlapping time intervals and at second logic potentials (e.g., logic 0) during overlapping time intervals. In response to the master clock signals, the memory bank control circuit disposes the first bank of memory cells in an active mode of operation when the first master clock signal applied thereto has an amplitude equal to the first logic potential and disposes the second bank of memory cells in an active mode of operation when the second master clock signal applied thereto has an amplitude equal to the first logic potential.

18 Claims, 3 Drawing Sheets

INTEGRATED CIRCUIT MEMORY DEVICES HAVING IMPROVED DUAL MEMORY BANK CONTROL CAPABILITY AND METHODS OF OPERATING SAME

FIELD OF THE INVENTION

The present invention relates to integrated circuit semiconductor devices, and more particularly to integrated circuit memory devices and methods of operating integrated circuit memory devices.

BACKGROUND OF THE INVENTION

In a system hierarchically adopting general memory devices, a standard DRAM has a narrow bandwidth. Thus, in order to increase data transmission efficiency by transmitting more data within a predetermined time interval, conventional memory bank interleaving methods have been used. According to prior art bank interleaving methods, a plurality of memory devices are separated into two or more banks so that data can be obtained continuously from each bank based on signals provided by a memory controller. For example, as illustrated by FIG. 1, a conventional integrated circuit memory device containing DRAM memory cells therein includes a master signal generator 1 for generating a master signal PR, based on a row address strobe signal $\overline{RAS}$ and the most significant bit (MSB) of a row address, a control circuit 3 operating in response to the master signal PR, and a memory array 5 operating in response to an output signal of the control circuit 3. As will be understood by those skilled in the art, the conventional memory device of FIG. 1 has a single bank operating structure in which a respective bank of memory cells is disposed in an active mode of operation when the row address strobe signal $\overline{RAS}$ is "low" and in a conventional precharge mode of operation when $\overline{RAS}$ is "high". Thus, a change in the MSB of the row address must take place to initiate a new active mode of operation after the precharge mode of operation has been completed.

Thus, according to conventional standard DRAM-based memory devices, simultaneous operation of two memory banks selected by the MSB typically requires two row address strobe signals $\overline{RAS}$.

SUMMARY OF THE INVENTION

It is therefore an object of the present invention to provide improved integrated circuit memory devices and methods of operating same.

It is another object of the present invention to provide integrated circuit memory devices having more efficient control circuits therein and methods of operating same.

These and other objects, features and advantages of the present invention are provided by integrated circuit memory devices having circuits therein for controlling at least one pair of memory banks (e.g., DRAM memory banks) therein using a single row address strobe ($\overline{RAS}$) signal, and methods of operating same. Memory devices according to preferred embodiments of the present invention include first and second banks of memory cells and memory bank control means coupled thereto for selectively disposing the first and second banks of memory cells in active modes of operation during respective nonoverlapping time intervals, in response to first and second master clock signals. The first and second master clock signals are generated by a single master clock signal generator comprising strobe buffer means and bank select buffer means therein. The strobe buffer means is responsive to a row address strobe signal and the bank select buffer means is responsive to outputs from the strobe buffer means and a bank select signal.

In particular, the strobe buffer means is responsive to a row address strobe signal $\overline{RAS}$ (having an amplitude which alternates between first and second binary logic potentials) and generates first and second control signals (PRAE and PR). The bank select buffer means is responsive to the first and second control signals PRAE and PR and a bank select signal (MSB) which may be the most significant bit of a row address, and generates the first and second master clock signals (PR1 and PR2) having amplitudes which alternate between first and second binary logic potentials. Here, the bank select buffer means preferably generates the first and second master clock signals at first logic potentials (e.g., logic 1) during nonoverlapping time intervals and at second logic potentials (e.g., logic 0) during overlapping time intervals. In response to the master clock signals generated by bank select buffer means, the memory bank control means disposes the first bank of memory cells in an active mode of operation when the first master clock signal applied thereto has an amplitude equal to the first logic potential and disposes the second bank of memory cells in an active mode of operation when the second master clock signal applied thereto has an amplitude equal to the first logic potential (e.g., logic 1). In addition, the memory bank control means disposes the first and second banks of memory cells in respective precharge modes of operation during overlapping time intervals when the amplitudes of the first and second master clock signals are at the second binary logic potentials (e.g., logic 0).

Preferred methods of operating integrated circuit memory devices containing first and second banks of DRAM memory cells therein include the steps of generating a row address signal having an amplitude which alternates between respective first and second binary logic potentials and generating a bank select signal having an amplitude which alternates between respective first and second binary logic potentials. The first bank of memory cells is switched from a precharge mode of operation to an active mode of operation if the amplitude of the bank select signal is at a second logic potential upon an occurrence of a transition in the amplitude of the row address strobe signal from the first logic potential to the second logic potential (e.g., 1→0). During nonoverlapping time intervals, the second bank of memory cells are also switched from a precharge mode of operation to an active mode of operation if the amplitude of the bank select signal is at a first logic potential upon an occurrence of a transition in the amplitude of the row address strobe signal from the first logic potential to the second logic potential (e.g., 1→0). The first and second banks of memory cells are also reset from an active mode of operation to a precharge mode of operation upon an occurrence of a transition in the amplitude of the row address strobe signal from the second logic potential to the first logic potential.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
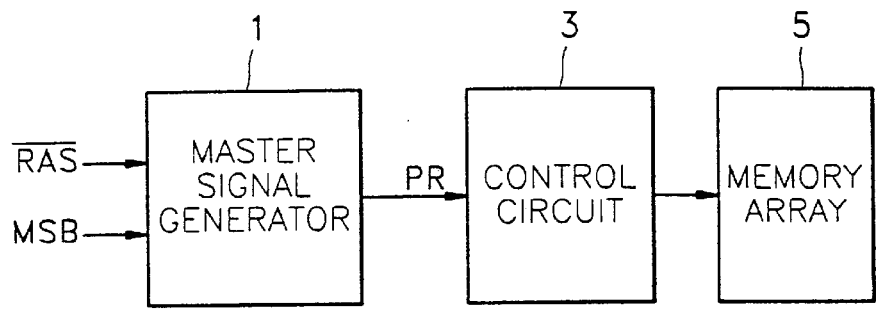
FIG. 1 is a block diagram of a circuit for controlling operation of a DRAM memory cell array in active and precharge modes, according to the prior art.
Figure 2:
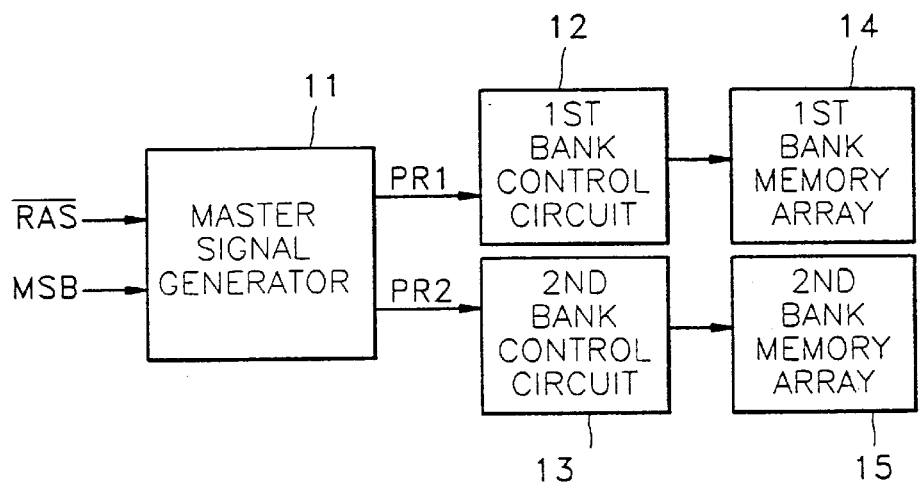
FIG. 2 is a block diagram of a circuit for controlling operation of a pair of DRAM memory cell arrays according to an embodiment of the present invention.

Referring to FIG. 2, integrated circuit memory devices according to present invention preferably include first and second banks of DRAM memory cell arrays 14 and 15 and first and second memory bank control circuits 12 and 13 for selectively disposing the first and second banks of memory cells 14 and 15 in active modes of operation during respective nonoverlapping time intervals in response to first and second master clock signals PR1 and PR2. A master signal generator 11 is also provided for generating the first and second master clock signals PR1 and PR2 in response to a single row address strobe signal $\overline{RAS}$ and a bank select signal which may be the most significant bit (MSB) of a row address. Here, the master signal generator 11 is comprised of a row address strobe buffer illustrated by FIG. 3 and a bank select bit buffer illustrated by FIG. 4. The row address strobe buffer generates first and second master control signals PRAE and PR in response to the row address strobe signal $\overline{RAS}$ and a predetermined control signal $\overline{PVCCH}$. In addition, the bank select bit buffer generates the first and second master clock signals PR1 and PR2 in response to the bank select signal MSB, the predetermined control signal and the first and second master control signals PRAE and PR.

Figure 3:
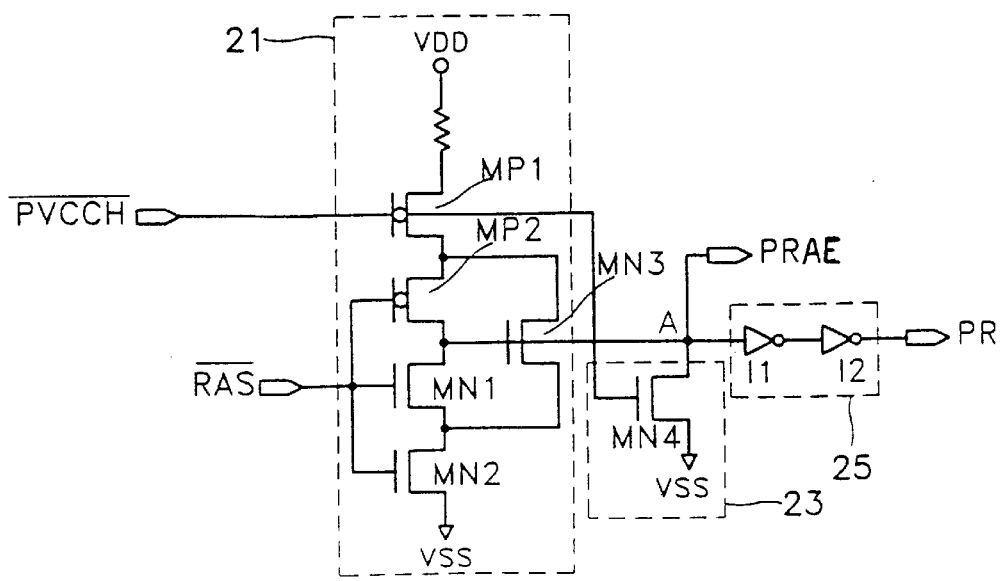
FIG. 3 is a detailed electrical circuit schematic of a row address strobe buffer according to an embodiment of the present invention.

Referring now to FIG. 3, a detailed electrical schematic of a preferred row address strobe buffer according to the present invention is illustrated. The row address strobe buffer preferably includes buffer means 21 for outputting a first master control signal PRAE to an output node A thereof in response to a row address strobe signal $\overline{RAS}$ and the predetermined control signal $\overline{PVCCH}$, pull-down means 23 for pulling down the output node A of the buffer means 21 in response to the predetermined control signal $\overline{PVCCH}$, and delay means 25 for delaying the first master control signal PRAE and outputting the second master control signal PR. In the buffer means 21, first and second PMOS transistors MP1 and MP2, and first and second NMOS transistors MN1 and MN2 are connected in series in the order stated between a power supply voltage VDD port and a ground voltage VSS port. Here, a third NMOS transistor MN3 is connected at a node between the first and second PMOS transistors MP1 and MP2, and at a node between the first and second NMOS transistors MN1 and MN2. In detail, the power supply voltage VDD is applied to the source of the first PMOS transistor MP1, the predetermined control signal $\overline{PVCCH}$ is applied to the gate thereof, and the source of the second PMOS transistor MP2 is connected to the drain of MP1. The row address strobe signal $\overline{RAS}$ is applied to the gate of the second PMOS transistor MP2, and the drain of MP2 is connected to the output node A. Also, the output node A is connected to the drain of the first NMOS transistor MN1. The row address strobe signal $\overline{RAS}$ is also applied to the gate of MN1, and the drain of the second NMOS transistor MN2 is connected to the source of MN1. The row address strobe signal $\overline{RAS}$ is also applied to the gate of the second NMOS transistor MN2 and the source of MN2 is connected to the ground voltage VSS. Furthermore, the drain of the first PMOS transistor MP1 is connected to the drain of the third NMOS transistor MN3, the output node A is connected to the gate of MN3, and the drain of the second NMOS transistor MN2 is connected to the source of MN3.

Figure 5:
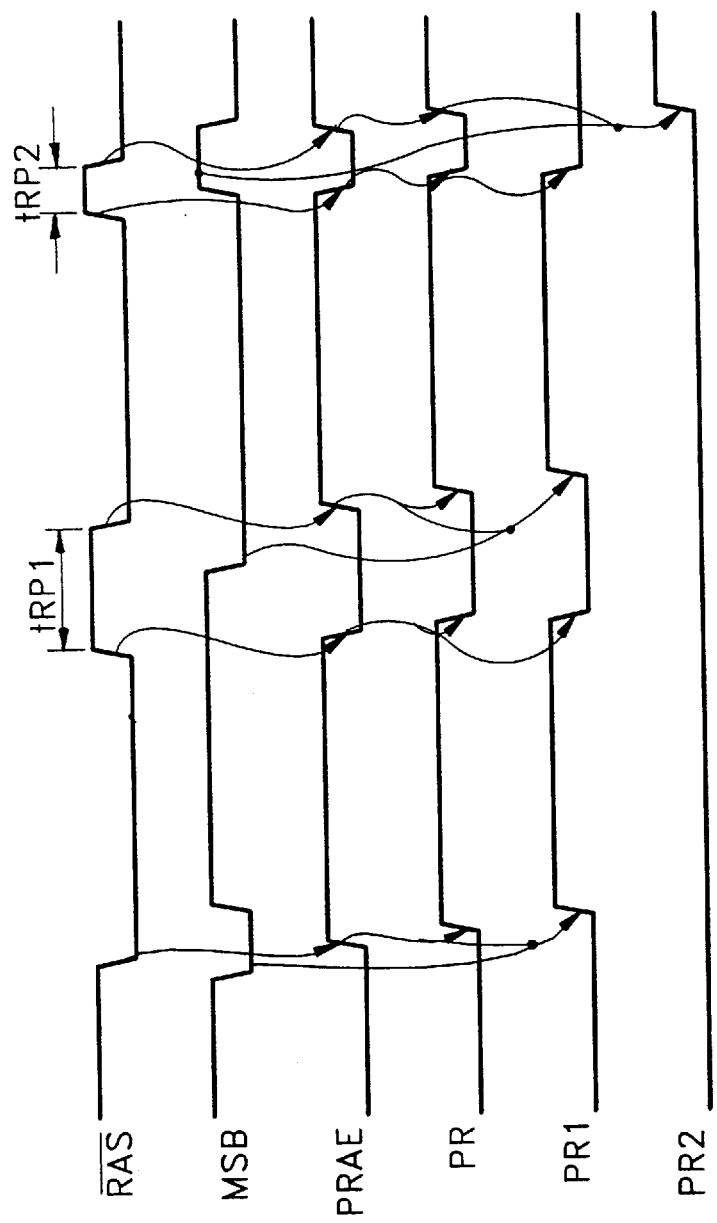
FIG. 5 is a timing diagram illustrating values of signals received and generated by the row address strobe buffer and bank select bit buffer of FIGS. 4–5.

The pull-down means 23 is comprised of a fourth NMOS transistor MN4 having a drain connected to the output node A, a gate to which the predetermined control signal $\overline{PVCCH}$ is applied and a source to which the ground voltage VSS is applied. The delay means 25 is comprised of an inverter I1 for inverting the first master control signal PRAE and an inverter I2 for inverting an output signal of the inverter I1. As will be understood by those skilled in the art, the buffer means 21 and pull-down means 21 collectively perform the function of a two-input NOR gate having the predetermined control signal $\overline{PVCCH}$ and row address strobe signal $\overline{RAS}$ as inputs. Thus, when the predetermined control signal is maintained at a logic 0 potential, the first master control signal PRAE becomes a delayed version of the compliment of the row address strobe signal $\overline{RAS}$ as illustrated by FIG. 5 described below.

Figure 4:
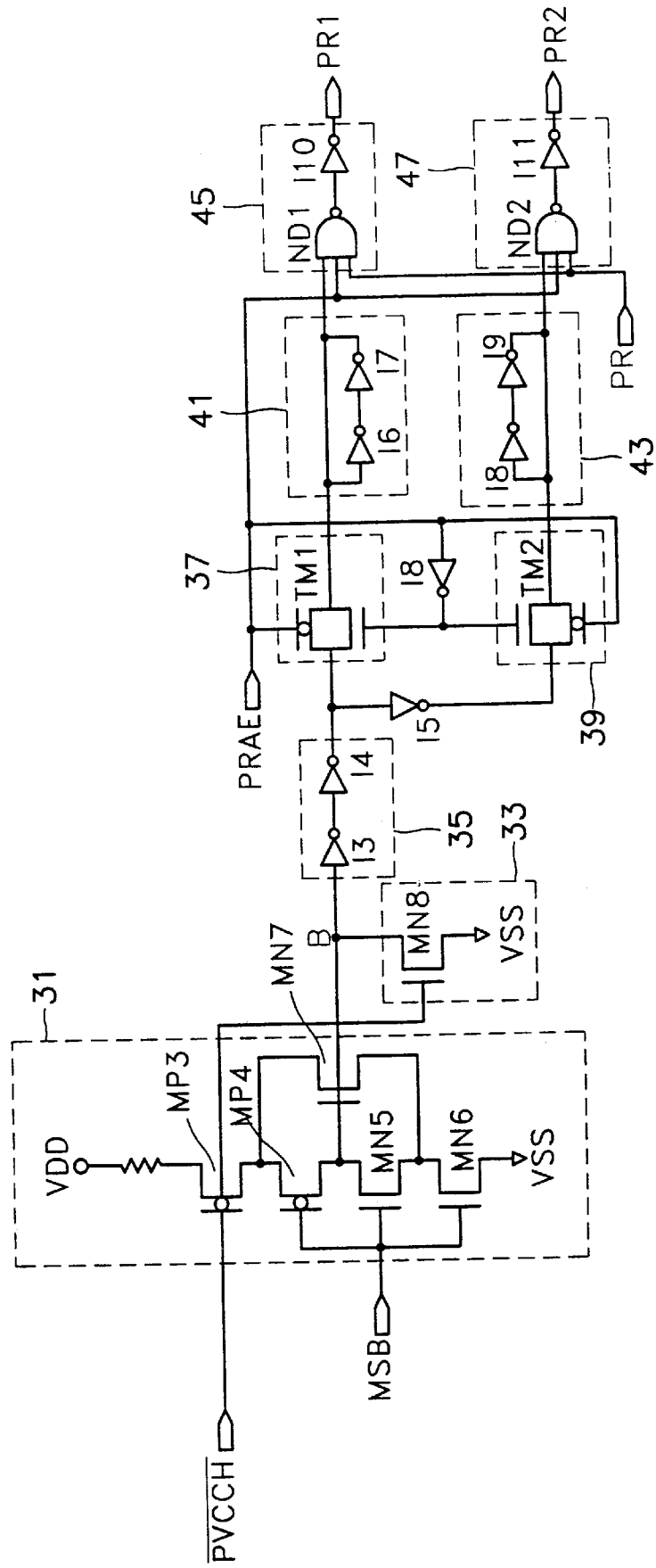
FIG. 4 is a detailed electrical circuit schematic of a bank select bit buffer according to an embodiment of the present invention.

Referring to FIG. 4, a detailed electrical schematic of a preferred bank select bit buffer is illustrated. The bank select bit buffer includes buffer means 31 for outputting an output signal to an output node B in response to the bank select bit MSB and the predetermined control signal $\overline{PVCCH}$, pull-down means 33 for pulling down the output node B of the buffer means 31 in response to the predetermined control signal $\overline{PVCCH}$, delay means 35 for delaying the output signal of the buffer means 31, an inverter 15 for inverting an output signal of the delay means 35, first and second transmit means 37 and 39 for transmitting the output signals of the delay means 35 and the inverter 15, respectively, in response to the first master control signal PRAE, first and second latch means 41 and 43 for latching the signals transmitted via the first and second transmit means 37 and 39, respectively, first logic means 45 for AND-operating the first and second master control signals PRAE and PR and the output signal of the first latch means 41 to thereby output a first master clock signal PR1, and second logic means 47 for AND-operating the first and second master control signals PRAE and PR and the output signal of the second latch means 43 to thereby output a second master clock signal PR2.

In the buffer means 31, first and second PMOS transistors MP3 and MP4, and first and second NMOS transistors MN5 and MN6 are connected in series in the order stated between a power supply voltage VDD port and a ground voltage VSS port. Here, a third NMOS transistor MN7 is connected at a node between the first and second PMOS transistors MP3 and MP4, and at a node between the first and second NMOS transistors MN5 and MN6. The power supply voltage VDD is applied to the source of the first PMOS transistor MP3, the predetermined control signal $\overline{PVCCH}$ is applied to the gate of MP3, and the drain of MP3 is connected to the source of the second PMOS transistor MP4. The bank select bit MSB is applied to the gate of the second PMOS transistor MP4 and the output node B is connected to the drain of MP4. Also, the output node B is connected to the drain of the first NMOS transistor MN5, the bank select bit MSB is applied to the gate of MN5, and the drain of the second NMOS transistor MN6 is connected to the source of MN5. The bank select bit MSB is also applied to the gate of the second NMOS transistor MN6 and the ground voltage VSS is applied to the source of MN6. In addition, the drain of the first PMOS transistor MP3 is connected to the drain of the third NMOS transistor MN7, the output node B is connected to the gate of MN7, and the drain of the second NMOS transistor MN6 is connected to the source of MN7. The pull-down means 33 is comprised of a fourth NMOS transistor MN8 where the drain is connected to the output node B, the predetermined control signal $\overline{PVCCH}$ is applied to the gate and the ground voltage VSS is applied to the source. Here, the buffer means 31 and pull-down means 33 collectively perform the equivalent boolean function of a two-input NOR gate.

The delay means 35 is comprised of an inverter 13 for inverting the output signal of the buffer means 31 and an inverter 14 for inverting an output signal of the inverter 13. The first and second transmit means 37 and 39 are comprised of transmission gates TM1 and TM2, respectively, for transmitting the output signals of the delay means 35 and the inverter 15 when the first master control signal PRAE is at a logic 0 potential. The first latch means 41 includes an inverter 16 having an input node connected to the output node of the first transmit means 37 and an inverter 17 having an input node connected to an output node of the inverter 16 and an output node connected to the output node of the first transmit means 37. Also, the second latch means 43 is comprised of an inverter 18 having an input node connected to the output node of the second transmit means 39, and an inverter 19 having an input node connected to an output node of the inverter 18 and an output node connected to the output node of the second transmit means 39. The first logic means 45 includes a NAND gate ND1 and an inverter 110, and the second logic means 47 include a NAND gate ND2 and an inverter 111.

Referring now to FIG. 5, the operations of an integrated circuit memory device according to the present invention will be described. As shown by the timing diagram of FIG. 5, when the row address strobe signal $\overline{RAS}$ is set to or maintained at a "high" or logic 1 potential, the NMOS transistors MN1 and MN2 shown in FIG. 3 are activated, so that the first master control signal PRAE is held at a "low" or logic 0 potential, and the second master control signal PR is also held at a "low" potential after being delayed for a predetermined time. Accordingly, the first and second master clock signals PR1 and PR2 which are output signals of the first and second logic means 45 and 47 (shown in FIG. 4) both become low, and then the first and second bank memory arrays 14 and 15 shown in FIG. 2 both perform the precharging operation.

Thereafter, when the bank select bit MSB is toggled from "high" to "low", the second PMOS transistor MP4 of FIG. 4 is activated and the first and second NMOS transistors MN5 and MN6 are deactivated. Here, since the control signal $\overline{PVCCH}$ is maintained at a logic 0 potential, the first PMOS transistor MP3 is already activated. Thus, a "high" data signal is stored in the first latch means 41 via the inverters 13 and 14 and the transmission gate TM1. Also, the "low" data inverted by the inverter 15 is stored in the second latch means 43 via the transmission gate TM2. Then, when the row address strobe signal $\overline{RAS}$ is toggled from "high" to "low", the second PMOS transistor MP2 shown in FIG. 3 is activated and the first and second NMOS transistors MN1 and MN2 shown in FIG. 3 are deactivated. Here, since the first PMOS transistor MP1 shown in FIG. 3 is already activated, the first master control signal PRAE becomes "high". Accordingly, the transmission gates TM1 and TM2 shown in FIG. 4 are deactivated, so that the first latch means 41 holds at a logic 1 potential and the second latch means 43 holds at a logic 0 potential. Also, the first master control signal PRAE shown in FIG. 3 becomes "high", and then the second master control signal PR becomes "high" after a predetermined time. As a result, the first master clock PR1 (which is the output signal of the first logic means 45) is enabled to "high", and the second master clock PR2 (which is the output signal of the second logic means 47) is disabled to "low".

That is, when the row address strobe signal $\overline{RAS}$ is toggled from "high" to "low", the first master clock PR1 is enabled to "high" if the bank select bit MSB is "low" at the time $\overline{RAS}$ transitions from 1→0. As a result, the first bank memory array 14 performs active operations in response to the first bank control circuit 12 shown in FIG. 2. If the bank select bit MSB is "high" at the time $\overline{RAS}$ transitions from 1→0, the second master clock PR2 is enabled to "high", so that the second bank memory array 15 performs actives operations in response to the second bank control circuit 13.

Then, when the row address strobe signal $\overline{RAS}$ is toggled from "low" to "high", the second PMOS transistor MP2 of FIG. 3 is deactivated and the first and second MNOS transistors MN1 and MN2 are activated. As a result, the first master control signal PRAE becomes "low" and then the second master control signal PR becomes "low" after a predetermined time. Accordingly, the first and second master clocks PR1 and PR2 shown in FIG. 4 both become "low", so that the first and second bank memory arrays 14 and 15 shown in FIG. 2 come to perform the precharging operation again.

However, as shown in the time interval tRP2 of FIG. 5, if the row address strobe signal $\overline{RAS}$ is toggled to "low" within a shorter lapse of time than the lapse of the real precharge time tRP1 after the precharging operation occurs by toggling the row address strobe signal $\overline{RAS}$ to "high", and the bank select bit MSB is "high" under the above condition, the second master clock PR2 is enabled to "high" so that the second bank memory array 15 shown in FIG. 2 starts to perform the active operation. That is, while the first bank memory array 14 performs the precharging operation continuously, the second bank memory array 15 can start the active operation regardless of the precharging operation of the first bank memory array 14.

Accordingly, as described above, integrated circuit memory devices according to the present invention comprises memory bank control means 12–13 for selectively disposing the first and second banks of memory cells 14–15 (e.g., DRAM memory cells) in respective active modes of operation during respective nonoverlapping time intervals in response to first and second master clock signals PR1 and PR2. These master clock signals have amplitudes which alternate between first and second binary logic potentials (e.g., logic 1 and logic 0). Strobe buffer means, such as the row address strobe buffer of FIG. 3, is also provided for generating first and second control signals PRAE and PR. The strobe buffer means is responsive to the row address strobe signal $\overline{RAS}$ and the predetermined control signal $\overline{PVCCH}$. Bank select buffer means, such as the bank select bit buffer of FIG. 4, is also provided for generating the first and second master clock signals PR1 and PR2 at the first logic potential (e.g., logic 1) during nonoverlapping time intervals and at the second logic potential (e.g., logic 0) during overlapping time intervals. In particular, whenever the first and/or second master clock signals PR1 and PR2 are set to the second logic potential, the respective bank of memory cells 14–15 is disposed in a precharge mode of operation.

In addition, according to a preferred embodiment of the present invention, the amplitude of the first master clock signal PR1 is set to a logic 1 potential if the amplitude of the bank select signal (e.g., MSB) is at a logic 0 potential when the amplitude of the row address strobe signal $\overline{RAS}$ transitions from a logic 1 potential to a logic 0 potential (i.e., 1→0) while the predetermined control signal $\overline{PVCCH}$ is maintained at a logic 0 potential. Alternatively, the amplitude of the second master clock signal PR2 is set of a logic 1 potential if the amplitude of the bank select signal is at a logic 1 potential when the amplitude of the row address strobe signal $\overline{RAS}$ transitions from 1→0. As illustrated best by FIG. 5, the amplitudes of the first and second master clock signals PR1 and PR2 are reset to logic 0 potentials (or held at logic 0 potentials) whenever the amplitude of the row address strobe signal $\overline{RAS}$ transitions from a logic 0 potential to a logic 1 potential.

Referring again to FIGS. 3 and 4, the strobe buffer means preferably comprises a first NOR gate formed by buffer means 21 and pull-down 23 and the bank select buffer means comprises a second NOR gate formed by buffer means 31 and pull-down means 33. The bank select buffer means of FIG. 4 also comprises a pair of latches 41 and 43. The first latch 41 has a data input coupled to an output (node B) of the second NOR gate and the second latch 43 has a data input coupled to an output of an inverter 15 which provides the compliment of the data at node B. Here, the bank select buffer means also comprises first logic means 45 for outputting the first master clock signal PR1 by performing a boolean AND operation on the output of the first latch 41 and the first and second master control signals PRAE and PR and second logic means 47 for outputting the second master clock signal PR2 by performing a boolean AND operation on the complimentary output of the second latch 43 and the first and second master control signals PRAE and PR. Accordingly, the integrated circuit memory device of the present invention contains dual banks of memory cells which are operated by a single row address strobe signal $\overline{RAS}$. Here, even when the precharge time of the row address strobe signal $\overline{RAS}$ is below a reference value, the active operation of another bank can be performed while the precharging operation of a previously selected bank is still being performed.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   first and second banks of memory cells:
   memory bank control means, coupled to said first and second banks of memory cells, for selectively disposing said first and second banks of memory cells in active modes of operation during respective nonoverlapping time intervals in response to first and second master clock signals having amplitudes which alternate between first and second binary logic potentials;
   strobe buffer means, responsive to a row address strobe signal having an amplitude which alternates between first and second binary logic potentials, for generating first and second control signals: and
   bank select buffer means, responsive to the first and second control signals and a bank select signal having an amplitude which alternates between first and second binary logic potentials, for generating the first and second master clock signals at the first binary logic potential during nonoverlapping time intervals and at the second binary logic potential during overlapping time intervals;
   wherein said memory bank control means comprises means for disposing said first and second banks of memory cells in precharge modes of operation during overlapping time intervals when the amplitudes of the first and second master clock signals are at the second binary logic potentials.

2. The memory device of claim 1, wherein the second control signal is a delayed version of the first control signal.

3. The memory device of claim 2, wherein the amplitude of the first master clock signal is set to the first binary logic potential if the amplitude of the bank select signal is at the second binary logic potential when the amplitude of the row address strobe signal transitions from a logic 1 potential to a logic 0 potential.

4. The memory device of claim 3, wherein the amplitude of the second master clock signal is set to the first binary logic potential if the amplitude of the bank select signal is at the first binary logic potential when the amplitude of the row address strobe signal transitions from a logic 1 potential to a logic 0 potential.

5. The memory device of claim 4, wherein the amplitudes of the first and second master clock signals are reset to the second binary logic potentials whenever the amplitude of the row address strobe signal transitions from a logic 0 potential to logic 1 potential.

6. The memory device of claim 5, wherein said strobe buffer means comprises a first NOR gate; and wherein said bank select buffer means comprises a second NOR gate.

7. The memory device of claim 6, wherein said bank select buffer means further comprises a latch having a data input coupled to an output of the second NOR gate.

8. The memory device of claim 7, wherein the latch has a clock input coupled to an output of the first NOR gate.

9. The memory device of claim 8, wherein said bank select buffer means comprises means for outputting the first master clock signal by performing a boolean AND of an output of the latch and the first and second control signals.

10. The memory device of claim 9, wherein said bank select buffer means comprises means for outputting the second master clock signal by performing a boolean AND of a complementary output of the latch and the first and second control signals.

11. An integrated circuit memory device, comprising:
    first and second banks of memory cells;
    memory bank control means, coupled to said first and second banks of memory cells, for selectively disposing said first and second banks of memory cells in active modes of operation during respective nonoverlapping time intervals in response to first and second master clock signals having amplitudes which alternate between first and second binary logic potentials;
    strobe buffer means, responsive to a row address strobe signal having an amplitude which alternates between first and second binary logic potentials, for generating first and second control signals; and
    bank select buffer means, responsive to the first and second control signals and a bank select signal having an amplitude which alternates between first and second binary logic potentials, for generating the first and second master clock signals at the first binary logic potential during nonoverlapping time intervals and at the second binary logic potential during overlapping time intervals:

wherein said strobe buffer means comprises a first NOR gate; and wherein said bank select buffer means comprises a second NOR gate.

12. The memory device of claim 11, wherein said bank select buffer means further comprises a latch having a data input coupled to an output of the second NOR gate.

13. The memory device of claim 12, wherein the latch has a clock input coupled to an output of the first NOR gate.

14. The memory device of claim 13, wherein said bank select buffer means comprises means for outputting the first master clock signal by performing a boolean AND of an output of the latch and the first and second control signals.

15. The memory device of claim 14, wherein said bank select buffer means comprises means for outputting the second master clock signal by performing a boolean AND of a complementary output of the latch and the first and second control signals.

16. A method of operating an integrated circuit memory device containing first and second banks of memory cells therein, comprising the steps of:

generating a row address strobe signal having an amplitude which alternates between respective first and second binary logic potentials;

generating a bank select signal having an amplitude which alternates between respective first and second binary logic potentials;

switching the first bank of memory cells from a precharge mode of operation to an active mode of operation if the amplitude of the bank select signal is at a first logic potential upon an occurrence of a transition in the amplitude of the row address strobe signal from the first logic potential to the second logic potential; and switching the second bank of memory cells from a precharge mode of operation to an active mode of operation if the amplitude of the bank select signal is at a second logic potential upon an occurrence of a transition in the amplitude of the row address strobe signal from the first logic potential to the second logic potential.

17. The method of claim 16, further comprising the step of switching at least one of the first and second banks of memory cells from a respective active mode of operation to a precharge mode of operation upon an occurrence of a transition in the amplitude of the row address strobe signal from the first logic potential to the second logic potential.

18. The method of claim 17, wherein said step of switching at least one of the first and second banks of memory cells from a respective active mode of operation to a precharge mode of operation is performed irrespective of whether the amplitude of the bank select signal is equal to the first or second logic potential at the time of the transition in the amplitude of the row address strobe signal from the first logic potential to the second logic potential.

* * * * *